United States Patent [19]
Momtaz et al.

[11] Patent Number: 5,950,115
[45] Date of Patent: Sep. 7, 1999

[54] GHZ TRANSCEIVER PHASE LOCK LOOP HAVING AUTOFREQUENCY LOCK CORRECTION

[75] Inventors: Afshin D. Momtaz, Irvine; Mohammad S. Nejad, Aliso Viejo, both of Calif.

[73] Assignee: Adaptec, Inc., Milpitas, Calif.

[21] Appl. No.: 08/924,028

[22] Filed: Aug. 29, 1997

[51] Int. Cl.[6] .................................................. H04B 1/38
[52] U.S. Cl. ........................... 455/73; 375/219; 375/327; 327/147; 327/148
[58] Field of Search .................................. 455/73, 85, 88, 455/108.3; 375/219, 294, 327, 375, 376; 327/147, 148, 146, 155, 156, 157

[56] References Cited

U.S. PATENT DOCUMENTS

| | | | |
|---|---|---|---|
| 4,584,690 | 4/1986 | Cafiero et al. | 375/219 |
| 5,319,798 | 6/1994 | Watanabe | 455/76 |
| 5,481,207 | 1/1996 | Craft | 326/86 |
| 5,550,860 | 8/1996 | Georgiou et al. | 375/220 |
| 5,566,204 | 10/1996 | Kardontchik et al. | 375/219 |
| 5,621,755 | 4/1997 | Bella et al. | 375/219 |
| 5,703,511 | 12/1997 | Okamoto | 327/157 |
| 5,745,532 | 4/1998 | Campana, Jr. | 375/347 |

*Primary Examiner*—Wellington Chin
*Assistant Examiner*—Congvan Tran
*Attorney, Agent, or Firm*—Christie, Parker & Hale, LLP

[57] ABSTRACT

A transceiver circuit used in connection with a fiber channel serial interface is designed and constructed with transmitter and receiver phase lock loop sections, each acquiring velocity lock with respect to a 106.25 MHz reference clock signal. The transmitter phase lock loop section is maintained in velocity lock during serialization of a 10-bit encoded transmission character. The receiver phase lock loop section is operative in a phase-only mode during de-serialization and byte synchronization of a 1.0625 GHz serial data stream. VCO control voltages of both the transmitter and receiver phase lock loop sections are monitored and evaluated by a comparison circuit such that if the receiver phase lock loop section looses lock, its VCO control voltage will exceed a pre-determined lock range value, triggering an output of the comparison circuit. The output trigger of the comparison circuit automatically commands the receiver phase lock loop section to reacquire velocity lock and maintains the receiver phase lock loop section in velocity lock mode until such time as the receiver VCO control voltage returns to about its nominal value. Frequency lock correction is applied to the receiver phase lock loop section automatically and is a function solely of the receiver phase lock loop frequency deviation from its nominal value.

20 Claims, 4 Drawing Sheets

GHZ TRANSCEIVER PHASE LOCK LOOP HAVING AUTOFREQUENCY LOCK CORRECTION

RELATED APPLICATIONS

This application is related to co-pending applications entitled High Speed Phase Lock Loop Having High Precision Charge Pump With Error Cancellation, and High Speed Phase Lock Loop Having Constant Bandwidth, both filed on instant date herewith and commonly owned by the Assignee of the present invention, the entire disclosures of which are expressly incorporated herein by reference.

FIELD OF THE INVENTION

The present invention is directed to high speed data transmission and conversion systems and, more particularly, to a system and method for maintaining frequency lock of a GHz receiver phase lock loop in the event of serial link interruptions to ensure synchronization of an asynchronous data stream without reinitialization.

BACKGROUND OF THE INVENTION

The past few years have seen a dramatic increase in the speed of data transmission capabilities among and between the various components of a computer system or between multiple computer systems connected together in a network configuration. Indeed, since the general acceptance of personal computer systems in the 1960's, data transmission speeds have grown with an almost power law dependence; about 1 MHz in the '60's, 10 MHz in the '70's, 100 MHz in the '80's, and 1 GHz speeds being routinely achieved in the '90's.

The development of optical fibre for transmission of digital data streams has become a particular enabling technology for modern day 1 GHz data transmission speeds and, in the computer industry, has given rise to a data transfer protocol and interface system termed Fibre-Channel. Fibre-Channel technology involves coupling various computer systems together with optical fibre or a fibre channel-type electrically conductive (copper) cable and allows extremely rapid data transmission speeds between machines separated by relatively great distances. However, because of the physical characteristics of fibre channel-type cable, present day systems are capable of serial-fashion data transmission (at least when only a single optical fibre or electrical cable is used to interconnect various computer systems). In contrast, computer systems are configured to almost universally handle data in parallel fashion on byte-multiple signal busses (8-bit, 16-bit or 32-bit busses), making it incumbent on any data transmission system to provide some means for converting a 1 GHz serial data stream into a byte or byte-multiple parallel data stream. Conversely, since the fibre channel protocol contemplates two-way data transmission, computer systems that typically operate with parallel data structures must have some means for serializing a byte or byte-multiple data stream into a 1 GHz data signal suitable for transmission down an optical fibre or an electrically conductive (copper) cable.

Parallel data being serialized for high speed transmission is typically synchronous, in that the sequence of 1's and 0's making up the resulting serial data stream occurs with reference to a synchronized, uniform, single-frequency serializer clock signal. Encoding and transmitting the clock signal, together with data, would necessarily require an inordinate amount of valuable serial bandwidth and reduce the overall data transmission speed of a fibre channel system. Even though some small degree of self-clocking is inherent in the serial data stream, some method of evaluating the data stream must be used in order that a transceiver or serial-to-parallel data recovery system may determine how to appropriately frame the binary data stream into bytes.

In accordance with the Fibre-Channel 10-bit Interface specification, amplified in ANSI X3.230-1994 document, an encoded byte is 10-bits in length and is referred to as a transmission character. Data provided over a typical computer system's parallel architecture must be encoded and framed such that each data byte (8-bits from the point of view of the computer system) is formed into a transmission character, often termed a Fibre Channel 8B/10B encoded character. The resulting 8B/10B character must then be transmitted as 10 sequential bits at a 1.06 GHz data rate in accordance with the interface specification. Likewise, an incoming 8B/10B encoded transmission character must be received at a 1.06 GHz data rate and converted (framed) into the encoded 10 bit byte.

In the receiver case, many systems perform this function by using various types of clock recovery circuits, the most common of which is a phase-lock loop, which generates or regenerates a synchronous timing reference signal from a serial data stream and provides the timing reference to a data synchronizer or deserializer in order to mark-in time, the anticipated occurrence of a serial data bit. In effect, a phase-lock loop generates a synchronous stream of successive timing references, each timing reference representing, for example, a bit cell with which a data bit may be associated. For example, 10 consecutive timing references might represent a framed 8B/10B Fibre Channel transmission character which might then be latched out onto a 10-bit parallel bus by a, for example, deserializer comprising a 10-bit counter. The phase-lock loop clock recovery circuit, accordingly, is an essential component in modern day GHz transceiver systems.

In like fashion, transmitter sections are configured to receive an 8B/10B encoded transmission character and convert the 10-bit byte into serial data and transmit the serialized data at a 1.06 GHz data rate.

The frequency of clock signals recovered by, for example, a receiver phase lock loop, is subject to a number of variations introduced by the electronic components of such systems. Typically, the electronic components in the data path introduce some elements of phase and frequency noise which are random in nature and, more particularly, have dramatically varying band width characteristics depending on the geometric and electronic variations in modern semiconductor manufacturing process parameters. A phase lock loop such as comprises a 1.06 GHz to 106 MHZ transceiver, must take these variations into account when attempting to deal with a 1.06 GHz serial data stream.

Implementations of such a transceiver, typically include at least a phase-locked loop (PLL) normally comprising a phase or phase and frequency detector, a charge pump, an analog filter, and some means for generating a synchronous clock signal, such as a voltage controlled oscillator (VCO).

During initialization, or power-on reset, during what is conventionally termed a frequency or velocity lock, the oscillation frequency of the VCO is determined by, and locked to, the frequency of an external clock provided for such purpose, just prior to receiving an incoming serial data stream. Once frequency or velocity lock is established, the VCO runs in what might be termed a quasi-flywheel mode at a mean frequency determined during velocity lock. Subsequent correction control to the VCO frequency is developed by phase-locking a transition edge of the synchronous VCO signal to a transition edge of the data ONE bits of an incoming serial data signal. The VCO is phase-locked to the incoming serial data stream by comparing the phase of the rising edge of the VCO clock signal to the phase of the rising edge of a data ONE bit, in a phase detector. Phase or time differences detected between the two rising edges causes a control signal to be issued to a charge pump which either pumps-up or pumps-down the VCO, thus directing the VCO to either speed up or slow down in response to frequency variation in the data stream.

An analog low pass filter is typically provided between the charge pump and the VCO to reject corrections resulting from random high-frequency variations of individual data bytes, and allow ideally only corrections resulting from consistent frequency shifts of the data stream. The VCO is therefore locked to the mean phase of the data stream rather than to the phase of a particular data bit. Once phase-locked, the synchronous VCO signal provides for a recovered clock signal whose rate (frequency) is equal to the data bit rate or an integral multiple thereof.

A particular shortcoming of phase lock loop systems used in conjunction with a GHz serial data receiver is that such phase lock loop systems may easily lose frequency or velocity lock in the event of an interruption to the serial data stream, the serial link itself or upon the occurrence of a data ZERO overrun. The Fibre-Channel Interface specification defines the serial data stream as comprising no more than five sequential 1's or 0's in accordance with the fibre-channel coding algorithm. A large number of sequential ZERO'S caused by either corrupted data or a loss of the serial link, results in there being no data leading edges with which to compare the phase of a VCO signal. The receiver phase lock loop thus, "flywheels" in an almost open-loop mode with the magnitude of the last correction provided to the VCO by the charge pump being retained in the system and causing the VCO frequency to continually increase or decrease in response. In typical prior art systems, the VCO frequency shift continues until the phase lock loop system loses lock which is typically defined as a frequency deviation greater than the "lock range". The lock range is necessarily dependent on the bandwidth of the phase lock loop system but is commonly expressed as either a percentage of the mean frequency or some fixed value about the mean frequency. In typical GHz data transmission systems, the lock range for a phase lock loop VCO operating at about 1.06 GHz is commonly taken to be +\-2.5% or approximately +\-25 MHz.

Since the operational frequency of a VCO corresponds to the control voltage $V_c$, in a fashion well understood by those having skill in the art, typical prior art systems monitor the control voltage and define lock loss as a particular excursion (with either positive or negative polarity) of the control voltage beyond a nominal or median value. As a control voltage exceeds the lock threshold, a controller circuit (a microprocessor, microcontroller, digital signal processor, or the like) conventionally asserts an external signal termed lock reference or LCKREF which causes a receiver phase lock loop to enter frequency or velocity lock mode and reacquire lock.

As is well understood in the art, and which will be described in greater detail below, conventional receiver phase lock loop systems comprise alternate detector systems, a phase only detector operable in the data phase detection and deserializer mode, and a phase and frequency detector operable in response to an external synchronous clock (termed reference clock or REFCLK), by which the phase lock loop achieves velocity lock to a mean frequency corresponding to the mean frequency of the serial data stream. The LCKREF signal functions to switch the detection mode of the phase lock loop from phase only to phase and frequency detection during the assertion period of LCKREF. LCKREF is typically derived from an external timer and is asserted for a period of about 500 microseconds, following which LCKREF is deasserted and the PLL shifts from phase and frequency detection to phase only detection in anticipation of incoming data. Thus, upon loss of lock a phase lock loop has a period of about 500 microseconds in which to reacquire velocity lock prior to continuing its clock recover tasks.

It will be noted that, while effective in identifying lock loss and providing a means for velocity lock reacquisition, these prior art systems require an inordinate amount of time to reestablish proper operation following a frequency deviation beyond their lock ranges. For example, bit "jitter" and other random irregularities in the occurrence of a particular data ONE bit leading edge may cause a generally false, but ultimately correctable, phase lead or lag indication to a charge pump which sources or sinks a corresponding amount of current to or from a capacitor, in well known fashion, causing control changes to the VCO control voltage $V_c$. The output frequency of the VCO is increased or decreased, as appropriate. If, however, the incoming data signal next comprises a string of data ZEROS which is subsequently interrupted for a brief period of time, this last error indication will remain impressed on the VCO control voltage and, if large enough, will cause the VCO frequency to very quickly exceed the lock range. This entire process may occur in a period of time as brief as 25 to 50 microseconds, following which the serial link may recover. However, having exceeded its lock range, the phase lock loop is pulled off-line for a period of at least 500 microseconds, during which it must reestablish velocity lock before again phase-locking to data. This 500 microsecond period during which a receiver phase lock loop is off-line represents a lifetime in the GHz environment and corresponds to the loss of vast amounts of data expressed in fibre channel transmission characters.

Moreover, even after having reacquired velocity lock, it is highly unlikely that the serial data stream can be correctly framed into the proper 10-bit transmission characters. Data bytes provided to follow on circuitry will necessarily be corrupted causing the system to abort the data transfer and signal for re-transmission. Accordingly, in addition to the 500 microsecond technical delay caused by velocity lock reacquisition, frequency deviations in excess of a PLL's lock range most often result in re-transmission with a consequent halving of the effective data transmission rate.

Accordingly, there is a demonstrated need for a phase lock loop system in which the frequency characteristics of a receiver phase lock loop (clock recovery circuit) is monitored and the receiver phase lock loop automatically reestablishes frequency lock as soon as the monitored VCO frequency is seen to deviate beyond the lock range. Such a phase lock loop should be able to reestablish lock without the intervention of any external processing circuitry and at speeds at least an order of magnitude faster than the conventional 500 microsecond time period imposed by LCKREF.

SUMMARY OF THE INVENTION

There is provided in accordance with one aspect of the present invention, a transceiver circuit of the type adapted to interface between high-speed serial data and encoded transmission character bytes in accordance with the fibre channel interface specification. The transceiver circuit includes transmit and receive sections, each characterized by an operatively responsive to a phase lock loop. The transmitter section receives and serializes encoded transmission character bytes into a serial data stream while the receiver section receives and deserializes a serial data stream into encoded transmission character bytes.

The transmitter and receiver sections each comprise a phase lock loop which is operative in a frequency lock mode in response to a reference clock signal having a specific, uniform frequency and continuously operative at that frequency. The transmitter phase lock loop includes a phase and frequency detector, a charge pump and filter, and a voltage controlled oscillator operatively response to a VCO control voltage and having an output frequency which is an integral multiple of the reference clock frequency. The transmitter phase lock loop is continuously operative in frequency lock mode to lock the VCO output frequency to the integral multiple of the reference clock frequency.

The receiver phase lock loop is switchably operative in both frequency lock and phase lock modes and includes a phase and frequency detector and a phase only detector, each coupled to a charge pump and filter through a multiplex circuit. The multiplex circuit switchably selects either the phase only detector or the phase and frequency detector as the source of pump-up and pump-down signals provided to the charge pump, thus determining whether the receiver phase lock loop is operative in frequency lock or phase lock mode. The receiver phase lock loop further includes a voltage controlled oscillator responsive to a VCO control voltage and having an output frequency nominally the same as the output frequency of the transmitter voltage controlled oscillator.

A frequency lock correction circuit is connected to evaluate the magnitude of the receiver VCO control voltage against the magnitude of the transmitter VCO control voltage. The frequency lock correction circuit adaptively switches the receiver phase lock loop between frequency lock mode and phase lock mode in response to a measured difference between the receiver and transmitter VCO control voltages exceeding a threshold value.

In particular, both the receiver and transmitter phase lock loops are frequency locked to a 106.25 MHz reference clock signal to thereby cause their respective voltage controlled oscillators to operate at an output frequency of about 1.06 GHz. Frequency lock comparisons are performed by dividing the output frequency of each voltage controlled oscillator by 10 in a VCO divider. VCO control voltages for each voltage controlled oscillator are thus nominally at the same value so long as voltage controlled oscillators are operating at nominally the same frequency.

More particularly, the frequency lock correction circuit suitably comprises a comparator having a settable offset of about 100 millivolts which corresponds to a frequency deviation of about 200 MHz. When the receiver VCO control voltage value exceeds the transmitter VCO control voltage value by 100 millivolts or more, the comparator commands the multiplex circuit to switchably select the phase and frequency detector as the source of pump-up and pump-down signals to the charge pump of the receiver phase lock loop, thus commanding the receiver phase lock loop into frequency lock mode. When the receiver phase lock loop achieves frequency lock, its VCO control voltage will return to its nominal value, less than 100 millivolts different from the nominal value of the transmitter VCO control voltage, causing the comparator to command the receiver phase lock loop back into phase lock mode.

BRIEF DESCRIPTION OF THE DRAWINGS

These and other features, aspects and advantages of the present invention will be more fully understood when considered with respect to the following detailed description, appended claims and accompanying drawings, wherein:

DETAILED DESCRIPTION

Figure 1:
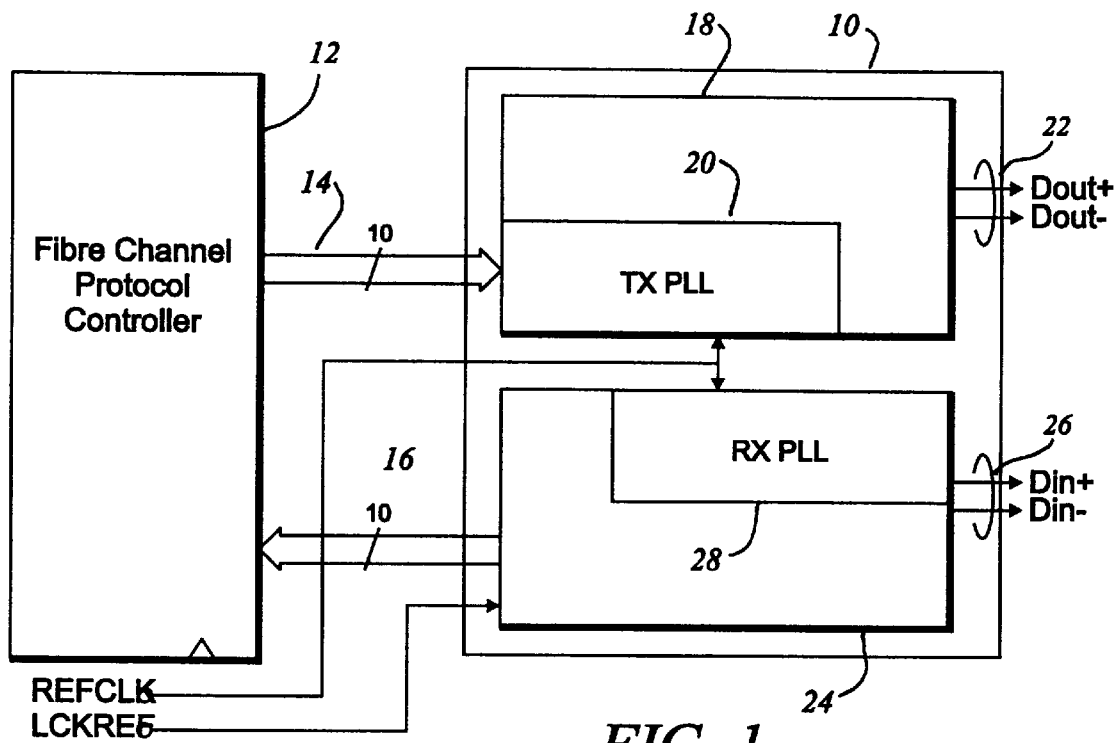
FIG. 1 is a semi-schematic, simplified block diagram of a typical Fibre Channel application comprising a protocol device coupled to a transceiver including transmitter and receiver phase lock loops.

Prior to describing one embodiment of the autofrequency lock reacquisition circuit of the present invention, it will be useful to have an understanding of the application of such a circuit in the context of a Fibre Channel-type high speed interface. Referring now to FIG. 1, a transceiver circuit 10 is configured to communicate with a, for example, fibre channel protocol device 12 which communicates 10-bit data words to and from the transceiver 10 over 10-bit wide parallel data buses; a transmitter bus 14 and a receiver bus 16. The transmitter and receiver busses, 14 and 16 respectively, function to communicate 8B/10B encoded transmission characters as TTL data, between the protocol device 12 and the transceiver 10. The transceiver 10 comprises a transmitter section 18 which accepts 10-bit wide parallel TTL data from the transmitter bus 14 and multiplexes this data into a high speed serial data stream operating at a 1.0625 GHz data rate. The TTL parallel data is expected to be 8B/10B encoded data, or equivalent, and is latched into an input register of the transmitter section on the rising edge of a 106.25 MHz signal termed reference clock or REFCLK. REFCLK is an externally provided signal, generated by a conventional clock circuit and is further provided to the protocol device 12 for use as a transmit byte clock signal.

A transmitter phase lock loop 20 locks to the externally supplied 106.25 MHz reference clock signal, in a manner to be described in greater detail below, which is then multiplied by 10, in order to generate the 1.0625 GHz serial signal clock defining the data rate of the high speed output. In accordance with the Fibre Channel 10-bit Interface specification, the transceiver 10 further comprises high speed serial data outputs capable of interfacing directly to Fibre Channel-type copper cables for electrical transmission or to a fibre optic module for optical transmission in well known fashion.

A receiver section 24 is coupled to a high speed serial data input 26 and further comprises a receiver phase lock loop 28 which locks onto a 1.0625 GHz incoming serial signal and recovers a high speed serial clock and data. In a manner to be described in greater detail below, serial data is converted into 10-bit parallel data and the recovered parallel data is provided to the protocol device 12 over the 10-bit wide parallel TTL data receiver bus 16. Byte alignment is established, in well known fashion, by recognizing the 8B/10B comma character which is defined specifically for synchronization purposes in Fibre Channel-type systems. The comma character is defined as a particular pattern, comprising "0011111XXX", where the leading ZERO corresponds to the first bit received. In accordance with the Fibre Channel Interface specification, the comma sequence is not contained in any normal 8B/10B coded data character or in any pair of adjacent characters. The comma sequence occurs only within a set of special characters defined as K28.1, K28.5 and K28.7 defined by the specification.

A lock reference signal, LCKREF, is directed to the phase lock loop 28 of the receiver section 24 and functions, in a manner to be described in greater detail below, to cause the PLL 28 to enter velocity lock mode. LCKREF is an external signal, typically asserted by controller circuitry operating under software or firmware program control, in response to certain pre-determined conditions. LCKREF is typically asserted during start up or power-on reset and has a duration of approximately 500 microseconds, during which time the receiver PLL 28 velocity locks to the 106.25 MHz REFCLK signal coupled to the PLL 28 for such purpose. After achieving velocity lock, the receiver lock 28 enter phase only mode in anticipation of recovering clock and data information from the high-speed serial data input lines 26.

Figure 2:
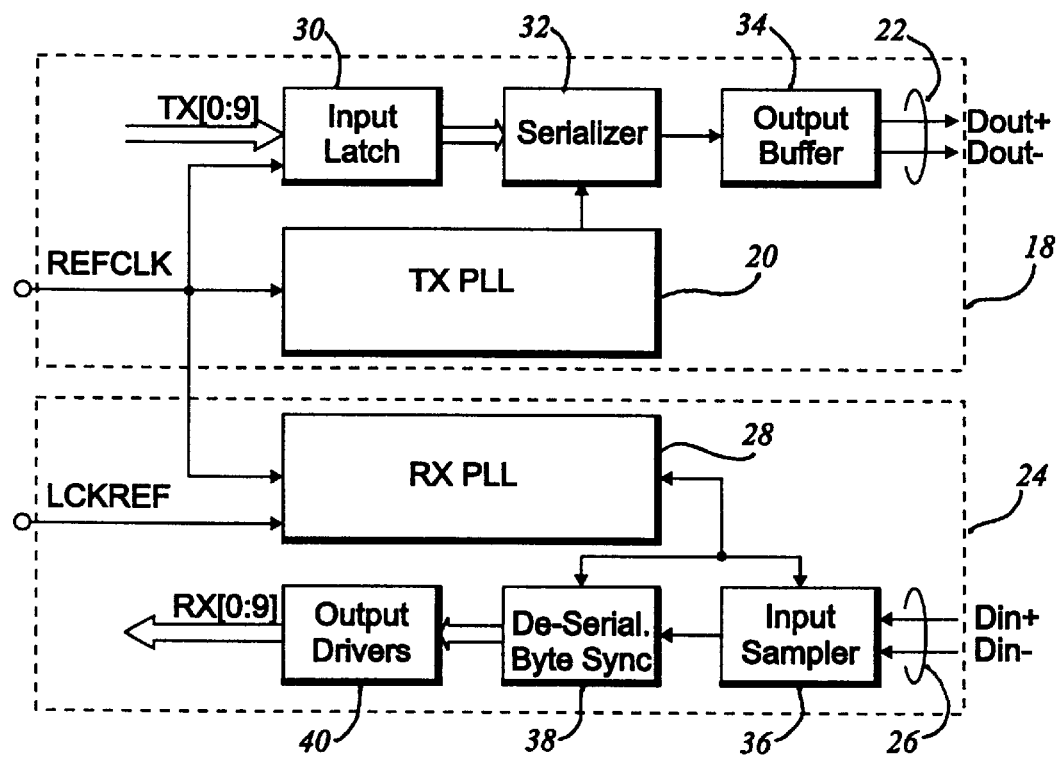
FIG. 2 is a semi-schematic, simplified block diagram of a transceiver circuit configured to transmit and receive 10-bit wide parallel data over a single high-speed data line.

Turning now to FIG. 2, the functional components of the transceiver 10 of FIG. 1, are depicted in semi-schematic, simplified block diagrammatic form. For ease of illustration, certain elements common to both FIG. 1 and FIG. 2 will be identified by common reference numerals. In FIG. 2, the transmitter section 18 is configured to receive 10-bit wide TTL parallel data over parallel transmitter bus 14 (TX[0:9]). 10-bit wide TTL parallel data is latched into the transmitter section 18 by an input latch 30 which is coupled to an externally provided reference clock signal, REFCLK, which also functions as a transmit byte clock for the input latch 30. REFCLK is further coupled to a transmit phase lock loop 20 (TX PLL) and clock synthesizer which is responsible for generating all internal clock signals required by the transmitter section 18 in order to perform its proper functions. Internal clock signals generated by the transmit PLL and clock synthesizer 20 are generated in operative response to the supplied reference byte clock (REFCLK) in a manner which will be described in greater detail below. It will be understood that REFCLK is thus used as both a frequency reference clock for the transmit PLL 20 and the transmit byte clock for incoming parallel data in the input latch 30. REFCLK is preferably a 106.25 MHz signal which is multiplied by 10 by the transmit PLL 20 in order to generate a 1.0625 GHz clock necessary for the high speed serial outputs.

A serializer 32 is coupled to and configured to accept 10-bit wide parallel data from the input latch 30. Parallel data received from the input latch 30 is multiplexed by the serializer 32 into a serial data stream in accordance with a 1.0625 GHz clock signal generated by the transmit PLL 20. Serial data bits are transmitted sequentially by an output buffer 34, from the least significant bit to the most significant bit of the encoded transmission character, in accordance with the Fibre Channel Interface specification. The output buffer 34 suitably comprises high speed output drivers which function to transmit the serial data stream over PECL differential outputs +\- DOUT comprising the high speed output lines 22.

A receiver section 24 is coupled to receive a serial data bit stream over high speed data input lines 26 comprising differential inputs +\- DOUT. The high speed data input lines 26 are coupled to an input sampler circuit 36 which functions to retime the serial input signal into a synchronous serial bit stream in operative response to a high speed serial clock recovered from the serial input signal by a receiver PLL and clock recovery circuit 28. Synchronized serial data is then directed to a deserializer and byte synk circuit 38 which restores 10-bit parallel data transmission characters from the high speed serial bit stream. In conventional fashion, the deserializer and byte sink circuit 38 further recovers two 53.125 MHz receiver byte clocks (not shown) which are 180° out-of-phase with one another and ultimately used by follow-on circuitry to clock the 10-bit parallel output data. The deserializer and byte sink circuit 38 further provides for "comma" character recognition and data word alignment by continuously sampling the serial data stream for the presence of the Fibre Channel "comma" character. Detection and recovery of a comma character is used to align, or realign, the receiver byte clock signals in order to properly align and correctly output synchronizing characters and subsequent data. Properly aligned, 10-bit parallel recovered data bytes are provided by an output driver 40 to a 10-bit wide parallel output data bus 16 to a, for example, fibre channel protocol circuit (12 of FIG. 1).

A receiver PLL and clock recovery circuit 28 is coupled to receive the high speed serial data and operates to extract a synchronization clock which is provided to the input sampler 36 and used to retime the incoming serial data stream. In order to accomplish this function, the receiver PLL 28 is coupled to receive REFCLK and frequency locks onto the 106.25 MHz reference clock signal provided at the REFCLK input. The receiver PLL 28 multiplies REFCLK by 10 in order to generate an internal 1.0625 GHz clock signal which is used to provide a phase reference to the incoming serial data stream to thus generate a recovered clock signal provided, in turn, to the input sampler 36 and deserializer 38. Frequency lock is accomplished during system start up, following a power-on-reset, or in the event of velocity lock loss, by the assertion of LCKREF for a period of at least 500 microseconds, in a manner to be described in greater detail below. Once the receiver PLL has achieved velocity lock, it enters a phase only lock mode in which the recovered clock signal is locked in phase to the incoming serial data stream.

Figure 3:
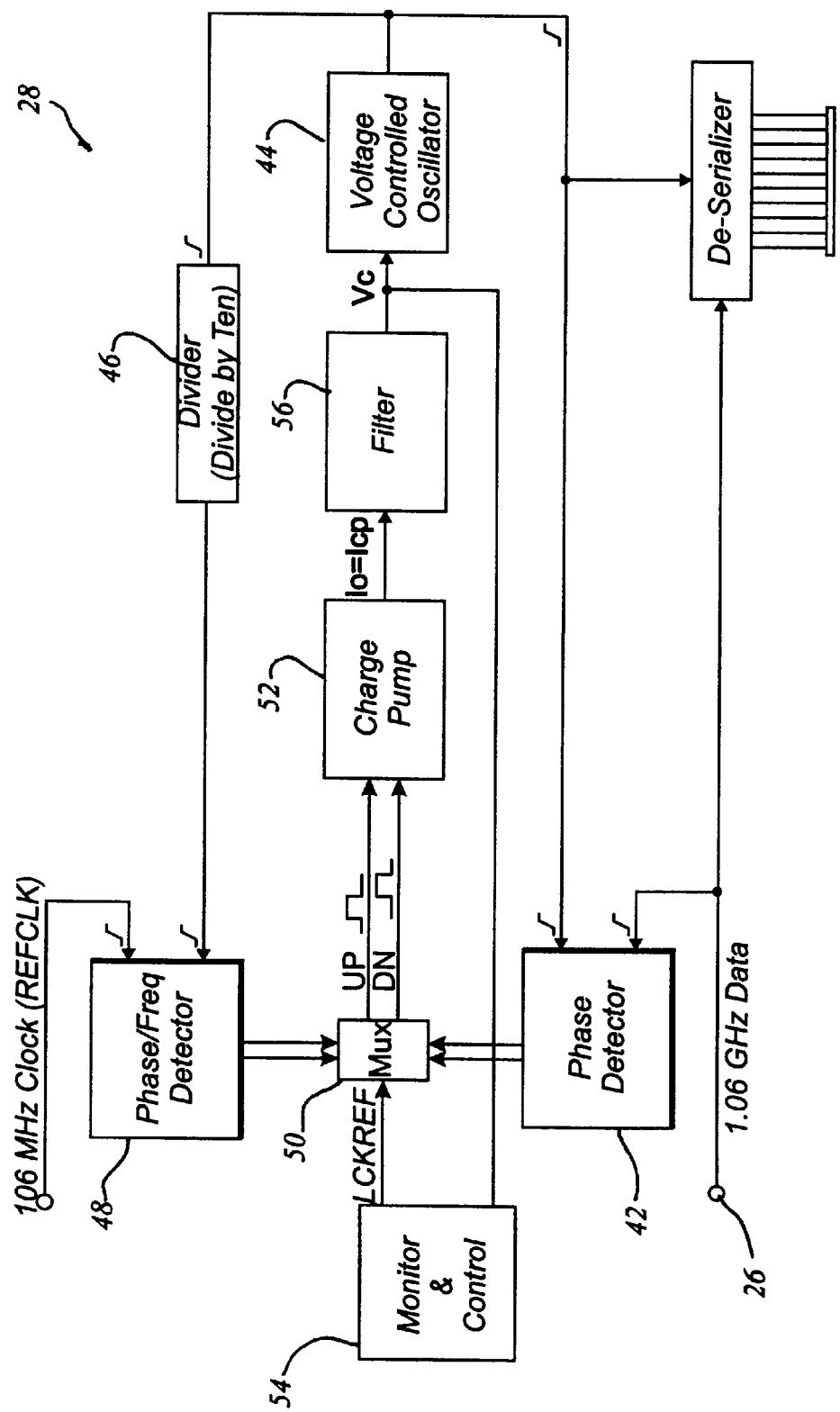
FIG. 3 is a semi-schematic, simplified block diagram of a receiver phase lock loop in accordance with the prior art.

With reference now to FIG. 3, there is illustrated in semischematic, simplified block diagram form, a receiver PLL and clock recovery circuit, indicated generally at 28, in accordance with the prior art. The receiver PLL 28 of FIG. 3 is suitable for use in the transceiver circuit of FIG. 2, but is disadvantageous in that loss of velocity lock must be rectified in conventional fashion.

In a manner which will be well understood by those having skill in the art, an incoming serial data stream is received over the serial link 26 and directed to a phase detector 42, wherein the rising edge of data bits comprising the serial data stream are compared in phase with the rising edge of a signal train provided by a voltage controlled oscillator (VCO) 44. Phase detector 42 may be constructed in accordance with a wide variety of well known techniques, but preferably comprises a type-IV phase detector, also known as a Charlie Hogge-type phase detector, whose construction and operational parameters are well understood by those having skill in the art. Briefly, a type-IV or Charlie Hogge phase detector operates to provide constant and spaced-apart UP and DN pulses to a charge pump irrespective of the logical state of a particular data bit appearing at the data inputs and, thus, irrespective of whether or not an actual phase comparison is taking place during a particular bit cell period.

This particular phase detector implementation scheme ensures that rising edges of the VCO signal, when compared to a data ZERO signal does not cause the PLL to become unstable. In well known fashion, the type-IV phase detector functions in accordance with NOR logic, such that the both the rising edge of the data ONE signal and the rising edge of a VCO signal are required to be present in order for the charge pump to truly perturb the system. In the absence of a data ONE or a VCO signal, the type-IV phase detector in effect operates the PLL in a "quasi flywheel" configuration.

An additional detector, a phase and frequency detector (PFD) 44 is also provided and coupled to receive a signal from a stable, external clock (denoted REFCLK) operating in the illustrated embodiment at 106.25 MHz. The phase and frequency detector 44 further includes a second signal input configured to receive the signal train output of the VCO 44 after it has been processed by a divide by 10 counter 46 (termed herein a VCO divider). The phase and frequency detector 44 will thus be understood to function so as to determine the median output frequency of the voltage controlled oscillator 44 by establishing the VCO frequency to an integral multiple of the frequency of the REFLCK signal. In the embodiment of FIG. 3, the integer factor is 10 and the VCO frequency is thus 10 times the REFCLK frequency or 1.0625 GHz.

The phase detector 42 and phase and frequency detector 44 each provide a pair of output signals (conventionally a pump-up signal and an pump-down signal) to a multiplexer 50 which is in turn coupled to provide a pump-up and pump-down signal (denoted UP and DN herein) to a charge pump 52. The multiplex circuit 50 operates to direct either the pump-up and pump-down signals from the phase detector 42 or the phase and frequency detector 48 to the charge pump 52 in response to the logical state of a selection signal, LCKREF. In a manner to be described in greater detail below, LCKREF directs the multiplex circuit 50 to choose which of the detectors will provide a pump-up and pump-down signal to the charge pump 52, depending on whether the receiver PLL 28 is in velocity lock mode or velocity acquisition mode.

During initialization, the receiver PLL 28 is put into frequency or velocity lock mode by a control circuit 54 which is typically external to the transceiver circuit and may suitably comprise a microcontroller, digital signal processor, and the like, operating under software or firmware program control, such that its tasking and operational parameters may be adaptively and dynamically defined by a user. As part of a start up or power-on reset procedure, control circuit 54 asserts LCKREF to the multiplex circuit 50 which configures the multiplex circuit to direct UP and DN to the charge pump 52 from the phase and frequency detector 48. A controlled-crystal oscillator, operating at a frequency of about 106.25 MHz is coupled to an input of the phase and frequency detector 48 where its frequency or velocity is compared with the frequency or phase velocity of the output of the VCO 44. The VCO divider 46 divides the frequency of the VCO 44 by 10 and provides that divided value to the phase and frequency detector 48. The results of the velocity comparison are provided as UP and DN control signals to the charge pump 52 which, in turn, adjusts the VCO frequency by sourcing or sinking current to or from a capacitor (in well understood fashion) to thereby adjust the VCO frequency by applying a control voltage $V_c$ through an analog filter section 56.

Conventionally, LCKREF is asserted for a period of about 500 microseconds, in order to give the receiver PLL 28 sufficient time to acquire velocity lock. Following the 500 microsecond lock period defined by LCKREF, LCKREF is de-asserted to the multiplex circuit 50. In response, the multiplex circuit 50 now switches the source of the UP and DN signals to the charge pump 52 to the phase detector 42. The VCO 44 is now operating at a mean frequency of 1.0625 GHz and the receiver PLL 28 is now ready to receive a serial data stream at a 1.0625 GHz data rate.

The control circuit 54 is also coupled to monitor the VCO control voltage ($V_c$) and further functions to determine whether the receiver PLL 28 looses lock by evaluating the VCO frequency as expressed by the control voltage ($V_c$). Well understood relationships exist between the control voltage $V_c$ and the VCO frequency making $V_c$ particularly suitable for monitoring the VCO performance. A quantifiable value for $V_c$ (of either polarity) may be established and defined as representing the lock range of a PLL which may be selected and programmed into the control circuit 54. When $V_c$ is observed to exceed the lock range, control circuit 54 asserts LCKREF in response, which causes the receiver PLL to reenter velocity lock mode by causing the multiplex circuit 50 to switch the source of the UP and DN signals to the charge pump 52 to the phase and frequency detector 48. In accordance with convention, and as described above, LCKREF remains asserted for a period of approximately 500 microseconds, following which LCKREF is de-asserted and the multiplex circuit 50 switches the source of UP and DN to the phase detector 42.

It will thus, be understood that a typical prior art-type phase lock loop based data recovery circuit comprises two separate loops; a phase and frequency loop and a phase only loop. After the PLL is locked to a known frequency by the phase and frequency loop, this loop is disabled and synchronization to an incoming data stream is performed in accordance with the phase only loop. The phase only loop ensures that the PLL output is in phase with the incoming data stream and if the input data frequency should drift slightly, the phase only loop is able to compensate for the drift so long as the data frequency change does not exceed the phase margin of the detector. However, if the drift is large enough or if the incoming data link is temporarily interrupted, the phase only loop is unable to compensate and it must be disabled in its turn and control passed to the phase and frequency loop for reacquisition.

This dual-loop system requires complex monitoring and control circuitry to evaluate the operational state of the PLL and in the event of a loss of velocity lock, disables the PLL for a significant period of time in order to reacquire lock prior to proceeding with data detection. In accordance with practice of principles of the present invention, such complex monitoring control circuitry is no longer necessary and the operational state of a receiver PLL (28 of FIGS. 2 and 3) may be simply and efficiently evaluated against a known frequency reference. Frequency lock corrections are automatically applied whenever the receiver VCO frequency deviates from the reference by a pre-set amount, with the correction period typically comprising no more than 1.3 microseconds.

Figure 4:
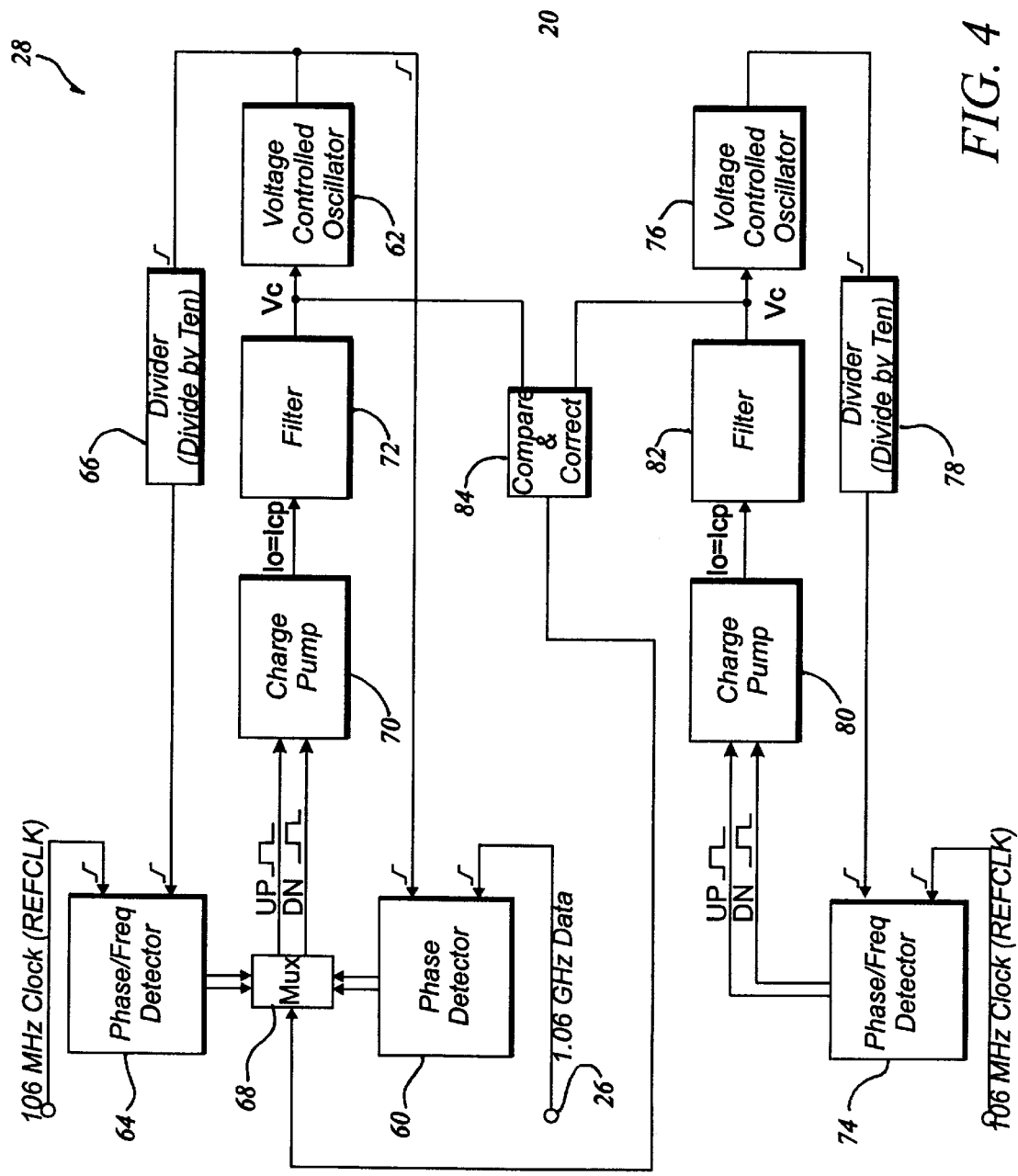
FIG. 4 is a semi-schematic, simplified block diagram of a transmitter and receiver phase lock loop configured for automatic frequency lock reacquisition in accordance with the present invention.

Turning now to FIG. 4, a transmitter phase lock loop 20 and receiver phase lock loop 28, in accordance with the present invention, are illustrated in semi-schematic simplified block diagram form. The receiver phase lock loop 28 suitably comprises a phase only detector 60 coupled to receive incoming 1.06 GHz data over a serial link 26 and compared in phase with the output of a voltage controlled oscillator 62. The receiver PLL 28 further comprises a phase and frequency detector 64, connected to receive a 106.25 MHz REFCLK signal from an external controlled-crystal oscillator, for example, as a frequency reference source. Phase and frequency detector 64 is further coupled to the output of the VCO 62 through a VCO divider 66 configured to divide the VCO output frequency by 10 prior to providing the divided VCO output signal to the phase and frequency detector for frequency comparison to REFCLK.

Both the phase only detector 60 and phase and frequency detector 64 have corresponding pump-up and pump-down outputs which are coupled to a multiplexer 68, configured to switch either the UP and DN signals from the phase detector or the UP and DN signals from the phase and frequency detector to a charge pump 70 which develops a VCO control voltage $V_c$ through an analog filter 72 in conventional fashion.

The transmitter phase lock loop 20 comprises a separate PLL loop which, as described in connection with FIG. 2, controls serialization of incoming parallel transmission characters into a 1.06 GHz serial data stream. The transmitter PLL 20 suitably comprises a phase and frequency detector 74 coupled to the 106.25 MHz REFCLK signal which serves as a phase and frequency reference for comparison to the output of a voltage controlled oscillator 76. In the illustrated embodiment, the VCO output is directed through a VCO divider 78 where its frequency is divided by an integer value, preferably 10, before it is provided to the phase and frequency detector 74 for phase and frequency comparison with the 106.25 MHz REFCLK signal. It will thus be understood that the nominal operational frequency of the transmitter VCO 76 will be 1.0625 GHz. The results of a phase and frequency comparison by the detector 74 is provided as an appropriate pump-up or pump-down signal to a charge pump 80 which develops a control voltage $V_c$ for the VCO 76 through an analog filter element 82 in well understood fashion.

It will be evident to those having skill in the art that the transmitter PLL 20 is operational in a constant lock mode and is continually locking the VCO frequency to an integral multiple of a constant, uniform, fixed and uninterrupted 1.0625 MHz signal train. In the illustrated embodiment of FIG. 4, the integer factor is 10 making it evident that the transmitter VCO 76 is being constantly locked to 10 times the REFCLK frequency, i.e., 1.0625 GHz.

Recognizing that the transmitter VCO 76 is operating at the same frequency as the incoming data frequency and, thus, the same frequency as the receiver VCO 62, the control voltage $V_c$ to the transmitter VCO 76 will be the same as the control voltage $V_c$ to the receiver VCO 62 when both the receiver VCO and the transmitter VCO have the same output frequency. In addition, each of the VCOs' input control voltages is proportional to the output frequency and thus indicates how closely each of the PLL's is operating with respect to its lock frequency.

In order to ensure the identity of $V_c$ for both receiver VCO 62 and the transmitter VCO 76, it is necessary to implement both VCOs the same, i.e., both should be ring-oscillators or multivibrators and, moreover, both should be constructed of the same sized transistors and with equal parasitic resistances and capacitances. Thus, if both VCos are operating at precisely 1.0625 GHz, their two control voltages ($V_c$) should have precisely the same value.

In accordance with practice of principles of the invention, the receiver control voltage, denoted as $V_{CR}$, and the transmitter control voltage, denoted $V_{CT}$, are compared in an autofrequency comparison and correction circuit 84 and, in a manner to be described further below, if the receiver control voltage $V_{CR}$ deviates more than a pre-determined amount from the transmitter control voltage $V_{CT}$, the comparison and correction circuit 84 issues an enable signal to the receiver multiplex circuit 68. In response, the multiplex circuit 68 switches between the phase only detector 60 and the phase and frequency detector 64 such that the receiver PLL 28 enters velocity lock mode. As soon as the receiver VCO 62 is operating at its nominal output frequency, as determined by its control voltage $V_{CR}$ the comparison and correction circuit 84 releases the signal to the receiver multiplex circuit 68 (in a manner to be further described below) and the receiver PLL 28 returns to phase only detection in anticipation of an incoming serial data stream.

Figure 5:
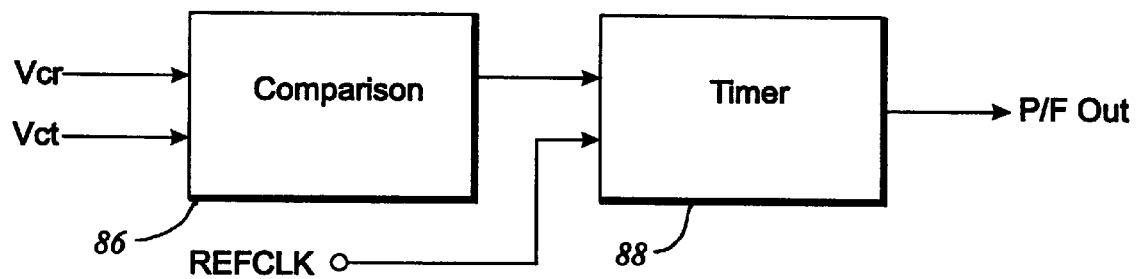
FIG. 5 is a semi-schematic simplified block diagram of an autofrequency comparison and correction circuit, including comparison and timing functions, in accordance with practice of principles of the invention.

Having reference now to FIG. 5, which is a semi-schematic simplified block diagram of the autofrequency comparison and correction circuit 84 of FIG. 4, it can be seen that the comparison circuit comprises generally two pertinent parts; a comparison circuit 86 and a timer 88. The comparison circuit 86 is configured with two inputs, one input connected to receive the receiver VCO signal, the other input connected to receive the transmitter VCO signal. The comparison circuit 86 performs a comparison function, wherein the value of the receiver VCO voltage is compared to the value of the transmitter VCO voltage and the absolute value of the difference is further compared to an offset reference voltage, defined as $\Delta V$, the magnitude of which is developed across a resistor divider powered by a current source, as will be detailed below. The magnitude of $\Delta V$ is preferably set to be in the range of from about 50 mV to about 150 mV and more preferably at about 100 mV. The particular magnitude chosen for $\Delta V$ will correspond to the maximum allowable excursion of $V_{CR}$ from its nominal value, the nominal value representing a receiver of VCO frequency of about 1.06 GHz. In the embodiment of the present invention, a 100 mV value assigned to the $\Delta V$ offset corresponds to an approximate 100 MHz frequency deviation of the receiver VCO from its nominal value.

Figure 6:
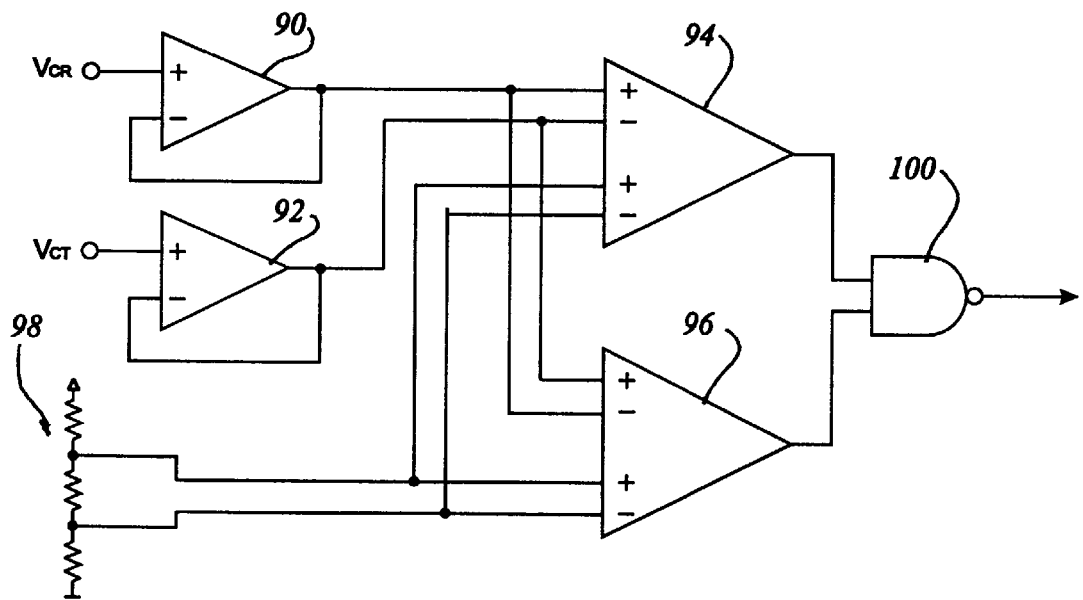
FIG. 6, is a semi-schematic, simplified circuit diagram of a VCO control voltage comparison block in accordance with practice of principles of the invention.

Turning now to FIG. 6, there is illustrated a semi-schematic simplified circuit diagram of the comparison circuit 86 of FIG. 5. In the embodiment of FIG. 6, each of the $V_c$ inputs (for carrying $V_{CR}$ and $V_{CT}$) are directed through respective unity gain buffers, 90 and 92, to the respective inputs of a pair of differential comparators, 94 and 96, wherein the difference in magnitude between $V_{CR}$ and $V_{CT}$ is compared with a reference offset voltage, $\Delta V$, developed across the center resistor of a three resistor divider network 98.

In operation, the $V_{CR}$ and $V_{CT}$ signals are directed through unity gain buffers 90 and 92 in order to isolate the comparator and voltage reference sections of the circuit from the rather sensitive VCO control voltage nodes. The unity gain buffers 90 and 92 are configured as voltage followers and reflect the $V_{CR}$ and $V_{CT}$ values into the comparator portion of the circuit.

Each of the differential comparators 90 and 94 comprise two pairs of differential inputs, one for evaluating the magnitude difference between $V_{CR}$ and $V_{CT}$ and the other for developing the voltage drop across the center resistor of the three element resistor divider network 98. In accordance with the illustrated embodiment, the values of the resistors comprising the network 98 are determined, in a manner which is well understood by those having skill in the art, in order to develop a voltage drop across the center resistor of about 100 mV. This 100 mV is provided at the reference inputs of the comparators 94 and 96 and defines the reference offset $\Delta V$ against which the magnitude difference between the VCO control voltages is compared.

In order to accommodate positive as well as negative differences, it will be seen that $V_{CR}$ is coupled to the positive one of the differential inputs of comparator 94 and to the negative one of the differential inputs of comparator 96. Likewise, $V_{CT}$ is connected to the negative one of the differential inputs of comparator 94 and to the positive one of the differential inputs of comparator 96. Thus, the difference between $V_{CR}$ and $V_{CT}$ is evaluated in absolute terms against the 100 mV reference. The outputs of the comparators 94 and 96 are directed through a NAND gate, such that the output of the comparison circuit is nominally an active low unless the magnitude of the difference between $V_{CR}$ and $V_{CT}$ exceeds 100 mV. At such time the output of the comparison circuit is put at a logical high.

Returning now to FIG. 5, the second portion of the autofrequency comparison and correction circuit comprises a timer 88 which is connected to the output of the comparison circuit 86 at one input and to REFCLK at a second input. Timer 88 suitably comprises a frequency divider and a latch such that when the output of comparison circuit 86 goes high, the logical high is latched to the output of the timer and held there for a period determined by the length of the frequency divider and the frequency of the REFCLK input. In the embodiment of the invention, REFCLK has an operational frequency of 106.25 MHz and the frequency divider is implemented such that the logical high from the comparison circuit 86 is latched to the timer output for a period of from about 500 nanoseconds to about 2.0 microseconds, preferably from about 1.0 microseconds to about 1.5 microseconds, and most preferably for a period of about 1.3 microseconds.

Accordingly, it will be seen that the correction and comparison circuit of the present invention is operative to put the receiver PLL into a velocity lock mode for only a brief period of time, i.e., substantially no more than that required to achieve lock.

The length of time required to reachieve velocity lock by the receiver PLL is primarily a function of PLL bandwidth but may also be expressed as a function of PLL gain. Embodiments for the present invention have been fabricated and characterized in order to determine the time required for the receiver PLL to correct its frequency. It has been experimentally determined that the correction period is typically in the range of about 500 nanoseconds or about 3 orders of magnitude faster than a correction period in accordance with the prior art.

It should be noted herein that the receiver PLL switches from a phase only detection loop to a phase and frequency detection loop, and back again, in direct response to the logical state of the comparison and correction circuit 84 of the present invention. The frequency of the receiver PLL 28 is thus dynamically maintained in lock as a function only of the control voltage $V_{CR}$ of the receiver VCO 62.

In addition, it will be immediately recognized by those having skill in the art that the conventional LCKREF signal is no longer required by a transceiver circuit constructed with a transmitter PLL, a receiver PLL and a means for automatically and adaptively accommodating receiver PLL frequency lock in accordance with practice of principles of the invention. For example, during initialization or power-on-reset, the transmitter PLL will necessarily phase and frequency lock to the 106.25 MHz REFCLK signal and provide a suitable voltage reference ($V_{CT}$) to the autofrequency lock means against which the receiver control voltage ($V_{CR}$) is compared. As the receiver PLL achieves velocity lock, the values of $V_{CR}$ and $V_{VT}$ will equate and the receiver PLL may be adaptively commanded to enter its phase only loop in anticipation of receiving an incoming serial data stream. Thus, transceiver operation, including velocity lock operations for both the transmitter and the receiver phase lock loops proceeds in a manner completely independent of any external command or control signals and without impacting on signal processing circuitry overhead. All that is required is a single, stable, uniform reference frequency by which to operate the transmitter PLL and with which to achieve velocity lock of the receiver PLL.

While not necessary for the proper functioning of the present invention, the response of both the transmitter and receiver PLL's may be significantly enhanced were their charge pumps constructed in accordance with co-pending application entitled High Speed Phase Lock Loop Having High Precision Charge Pump With Error Cancellation, filed on instant date herewith and commonly owned by the Assignee of the present invention, the entire disclosure of which is expressly incorporated herein by reference. The High Precision Charge Pump With Error Cancellation disclosed therein functions to maintain the stability of VCO lock by providing source and sink pump currents, the waveform characteristics of which are substantially symmetrical such that ringing and glitch errors are canceled so as to give a substantially zero average current when integrated over time. Thus, once lock has been achieved, the receiver PLL is able to maintain lock in a more controlled and stable fashion.

In addition, the transceiver of the present invention may also be provided with a High Speed Phase Lock Loop Having Constant Bandwidth as disclosed in co-pending application of the same name, filed on instant date herewith and commonly owned by the Assignee of the present invention, the entire disclosure of which is expressly incorporated herein by reference. The constant bandwidth characteristics of such phase lock loop would enhance the performance of both the receiver and transmitter PLL's of the present invention by stabilizing the value of the control voltages $V_{CR}$ and $V_{CT}$ of the PLL's. $V_{CR}$ and $V_{CT}$ will thus have a more linear correspondence to the receiver and transmitter VCO frequencies, making possible a more fine-grained definition of $\Delta V$ (the lock range).

A transceiver circuit has been described that includes a receiver phase lock loop which is adaptively and dynamically maintained in velocity lock by comparing an analogue of its VCO output frequency to a corresponding analogue of the VCO output frequency of a transmitter PLL operating in velocity lock mode in response to 106.25 MHz REFCLK signal. The receiver PLL comprises a phase and frequency loop and a phase only loop and a multiplex circuit which selects one or the other of the loops in operative response to a comparison between the two VCO frequency analogues. Whether the receiver PLL operates in phase and frequency mode or phase only mode is solely a function of the receiver PLL control voltage $V_{CR}$ and the transmitter voltage $V_{VT}$ and a pre-determined offset defining a lock range.

Thus, there has been brought to the art of high-speed phase lock loops an improved system and method for dynamically maintaining a receiver PLL in frequency lock to ensure its availability for synchronizing an incoming serial data stream. It will be recognized by those skilled in the art that various modifications may be made to the preferred and other embodiments of the invention described above, without departing from the broad inventive scope thereof. It will be understood, therefore, that the invention is not limited to the particular embodiments, arrangements or steps disclosed. It is rather intended to cover any changes, adaptations or modifications which are within the scope and spirit of the invention as defined by the appended claims.

We claim:

1. A transceiver circuit adapted to transmit and receive serial data signals at a 1.06 GHz data rate, the transceiver circuit including transmitter and receiver sections, the transmitter section for converting an encoded transmission character byte into a serial data stream, the receiver section for converting a serial data stream into an encoded transmission character byte, the transceiver circuit comprising:

a reference clock signal having a fixed, uniform frequency, the reference clock signal continuously operative at said frequency;

a transmitter phase lock loop operatively responsive to said reference clock signal the transmitter phase lock loop further providing a timing reference signal having a frequency an integral multiple of the frequency of said reference clock signal, the transmitter phase lock loop defining an internal control signal having a value corresponding to the frequency of said timing signal;

a receiver phase lock loop operatively responsive to said reference clock signal in a first, velocity lock, mode to thereby develop an output timing signal having a frequency an integral multiple of said reference clock signal frequency, the receiver phase lock loop defining an internal control signal having a value corresponding to the frequency of said timing signal, the receiver phase lock loop operatively responsive to a phase edge of an incoming serial data stream the data stream having a characteristic frequency substantially equal to the frequency of the receiver phase lock loop timing signal; and frequency lock correction means coupled between the transmitter phase lock loop and the receiver phase lock loop and connected to receive each loop's internal control signal, the frequency lock correction means for determining the relationship between the receiver output timing signal frequency and the transmitter output timing signal frequency, the frequency lock correction means further for asserting a trigger signal when the receiver timing signal frequency differs from the transmitter timing signal frequency by at least a specified value.

2. The transceiver circuit according to claim 1, the transmitter phase lock loop further comprising:

a phase and frequency detector connected to the reference clock signal at a first input and coupled to the timing reference signal at a second input, the detector coupled to the timing reference signal through a divider, the detector operative in frequency lock mode to define control signals corresponding to a comparison between the frequency of the reference clock signal and the divided timing reference signal;

a charge pump connected to receive control signals from the detector;

a filter; and a voltage controlled oscillator having an operational frequency, wherein control signals received by the charge pump are developed through the filter to thereby define an internal control signal for controlling the operational frequency, the internal control signal having a magnitude corresponding to the frequency.

3. The transceiver circuit according to claim 2, the receiver phase lock loop further comprising:

a phase and frequency detector connected to the reference clock signal at a first input and coupled to the timing reference signal at a second input, the detector coupled to the timing reference signal through a divider, the detector operative in frequency lock mode to define control signals corresponding to a comparison between the frequency of the reference clock signal and the divided timing reference signal;

a charge pump connected to receive control signals from the detector;

a filter; and a voltage controlled oscillator having an operational frequency, wherein control signals received by the charge pump are developed through the filter to thereby define an internal control signal for controlling the operational frequency, the internal control signal having a magnitude corresponding to the frequency.

4. The transceiver circuit according to claim 3, the receiver phase lock loop further comprising:

a phase only detector connected to the serial data stream at a first input and coupled to receive the timing reference signal at a second input, the phase only detector directly coupled to the timing reference signal and operative in a phase lock mode to define control signals corresponding to a phase comparison between serial data and the un-divided timing reference signal; and multiplex means for adaptively directing control signals from the phase only detector to the charge pump during phase lock mode and for directing control signals from the phase and frequency detector to the charge pump during frequency lock mode.

5. The transceiver circuit according to claim 4, wherein the transmitter internal control signal comprises a transmitter VCO control voltage and wherein the receiver internal control signal comprises a receiver VCO control voltage.

6. The transceiver circuit according to claim 5, wherein the transmitter VCO and the receiver VCO are each configured to provide a timing reference signal having substantially the same nominal frequency such that the transmitter VCO control voltage and the receiver VCO control voltage have substantially the same nominal magnitude.

7. The transceiver circuit according to claim 6, wherein the frequency lock correction means comprises a comparison circuit for comparing the magnitudes of the receiver and transmitter VCO control voltages, the comparison circuit commanding the receiver multiplex means to direct control signals from the receiver phase and frequency detector to the charge pump so as to enter frequency lock mode when the receiver VCO control voltage magnitude exceeds the transmitter VCO control voltage magnitude by a particular value.

8. In a transceiver circuit of the type adapted to interface between high-speed serial data and encoded transmission character bytes, the transceiver including transmit and receive sections each characterized by and operatively responsive to a phase lock loop, the transmitter section receiving and serializing encoded transmission character bytes into a serial data stream, the receiver section receiving and deserializing a serial data stream into encoded transmission character bytes, the transceiver comprising:

a reference clock signal having a specific, uniform frequency, the reference clock signal continuously operative at said frequency;

a transmitter phase lock loop including a phase and frequency detector operatively responsive to said reference clock signal, the transmitter phase lock loop further including a voltage controlled oscillator operatively responsive to a control voltage and having an output frequency an integral multiple of said reference clock frequency, the transmitter phase lock loop continuously operative to frequency lock the voltage controlled oscillator output frequency to said integral multiple of said reference clock frequency;

a receiver phase lock loop including a first, frequency lock, loop comprising a phase and frequency detector operatively responsive to said reference clock signal, the receiver phase lock loop further including a voltage controlled oscillator responsive to a control voltage and having an output frequency an integral multiple of the reference clock frequency, the receiver phase lock loop further operative in a second, phase lock, mode and further including a phase only detector connected to a serial data stream, the receiver phase lock loop operative to phase lock the voltage controlled oscillator to the phase of the serial data stream; and a frequency lock correction circuit connected to the transmitter and receiver phase lock loop control voltages, the frequency lock correction circuit for comparing the magnitude of said control voltages and adaptively switching the receiver phase lock loop from phase lock mode to frequency lock mode in response to a measured difference between the receiver and transmitter control voltages.

9. The transceiver circuit according to claim 8, the receiver phase lock loop further comprising:

a charge pump, switchably connected to receive control signals from the phase detector when the receiver loop is operative in the phase lock mode, the charge pump receiving control signals from the phase and frequency detector when the receiver loop is operative in the frequency lock mode;

a filter; and a multiplex circuit coupled between the phase only detector and the phase and frequency detector, the multiplex circuit directing control signals to the charge pump from the phase only detector in response to a control signal being in a first logical state, and directing control signals to the charge pump from the phase and frequency detector in response to a control signal being in a second logical state.

10. The transceiver circuit according to claim 9, wherein the frequency lock correction circuit defines an output connected to the multiplex circuit for carrying the control signal, the correction circuit asserting the output to a first logical state when the measured difference between the receiver and transmitter control voltages is below a threshold level, the correction circuit asserting the output to a second logical state when the measured difference between the receiver and transmitter control voltages is above the threshold level.

11. The transceiver according to claim 10, wherein the transmitter and receiver voltage controlled oscillators are operative at a nominal frequency of about 1 Ghz.

12. The transceiver according to claim 11, wherein the reference clock signal has a frequency in the range of from about 100 Mhz to about 115 Mhz.

13. The transceiver circuit according to claim 12, wherein the transmitter and receiver control voltages are VCO control voltages, each VCO control voltage corresponding to the operational frequency of their respective voltage controlled oscillators.

14. The transceiver circuit according to claim 13, wherein the threshold level of the measured difference between the transmitter and receiver VCO control voltages corresponds to a frequency difference of about 100 MHz.

15. A frequency lock correction circuit comprising:

a first phase lock loop including a phase and frequency detector, a charge pump and filter, and a voltage controlled oscillator responsive to a VCO control voltage developed by said charge pump and filter, the first phase lock loop operative in a frequency lock mode in response to a reference clock signal having a specific, continuous frequency, voltage controlled oscillator frequency locked to define an output frequency an integral multiple of the frequency of said reference clock signal;

a second phase lock loop switchably operative between a first, phase lock, mode and a second, frequency lock mode, the phase lock loop including a phase only detector, a phase and frequency detector, a charge pump and filter, and a voltage controlled oscillator responsive to a VCO control voltage, the second phase lock loop configured to phase lock to high-speed serial data provided at one input of the phase only detector and to frequency lock to the reference clock signal provided at one input of the phase and frequency detector; and frequency lock correction means connected to receive and compare the first and second VCO control voltages, the correction means for commanding the second phase lock loop to switch from phase lock mode to frequency lock mode in response to a measured difference between the first and second VCO control voltages exceeding a pre-set value.

16. The circuit according to claim 15, further comprising a multiplex circuit coupled between the phase detector and the phase and frequency detector of the second phase lock loop, the multiplex circuit switchably providing pump-up and pump-down signals from a selected one of the detectors to the charge pump in response to commands from the frequency lock correction means.

17. The circuit according to claim 16, wherein the reference clock signal has a frequency of from about 100 Mhz to about 115 Mhz.

18. The circuit according to claim 17, wherein the voltage controlled oscillators of the first and second phase lock loops are each operative at the same nominal frequency.

19. The circuit according to claim 18, wherein the oscillator nominal frequency is about 1 Ghz.

20. The circuit according to claim 19, wherein the high speed serial data has a data rate of about 1 GHz.

* * * * *